Figure 1:
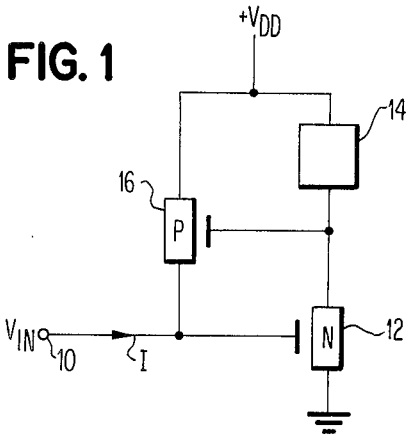
Figure 2:
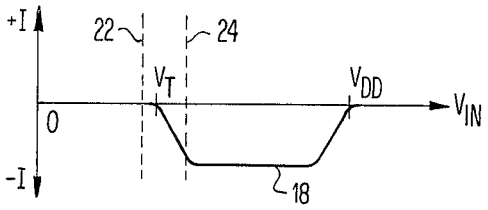
Figure 3:
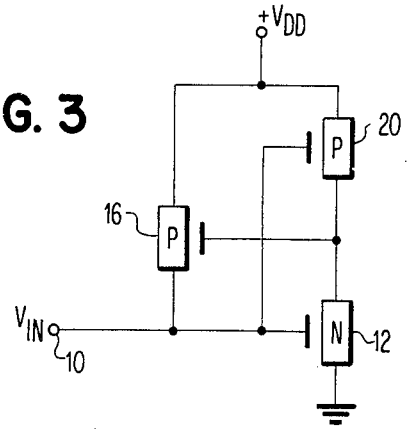
Figure 4:
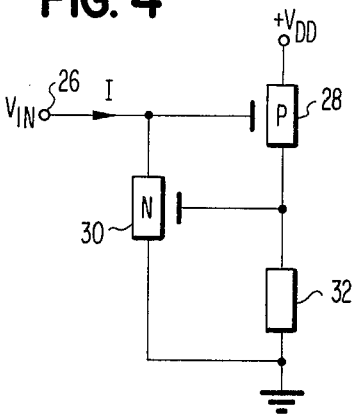
Figure 5:
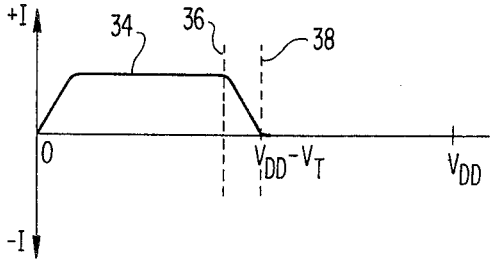
Figure 6:
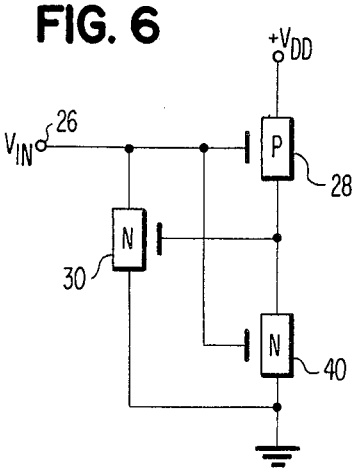
Figure 11:
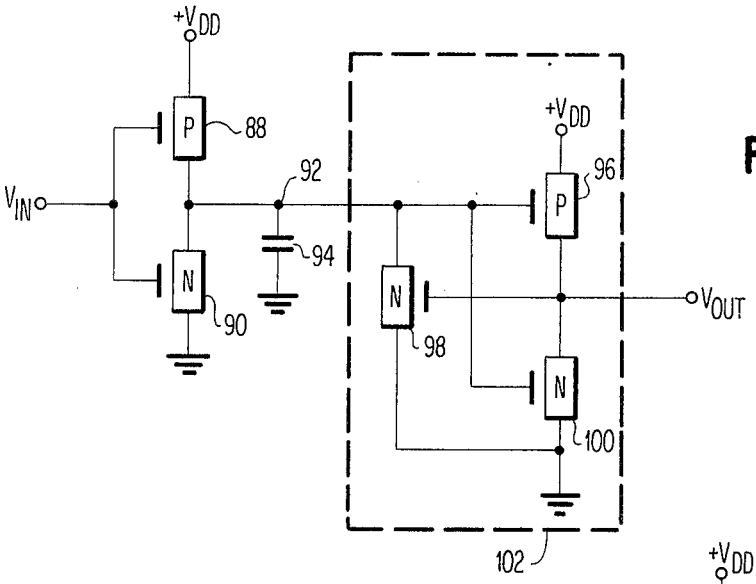
Figure 12:
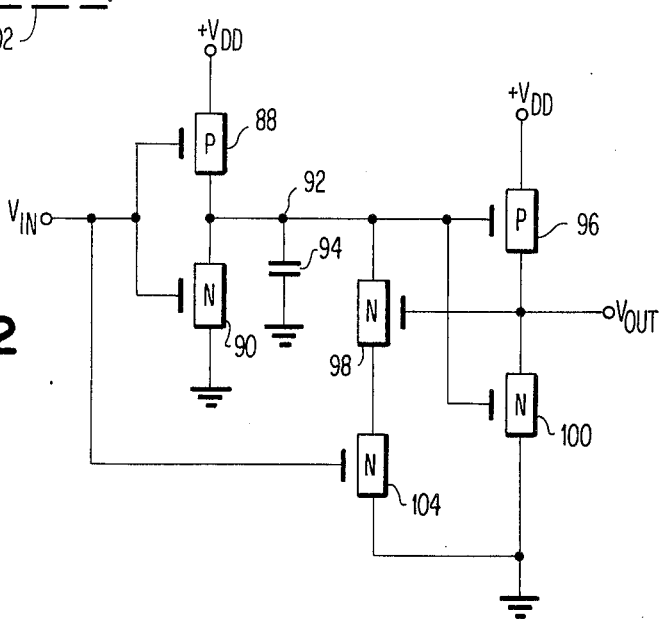
Figure 13:
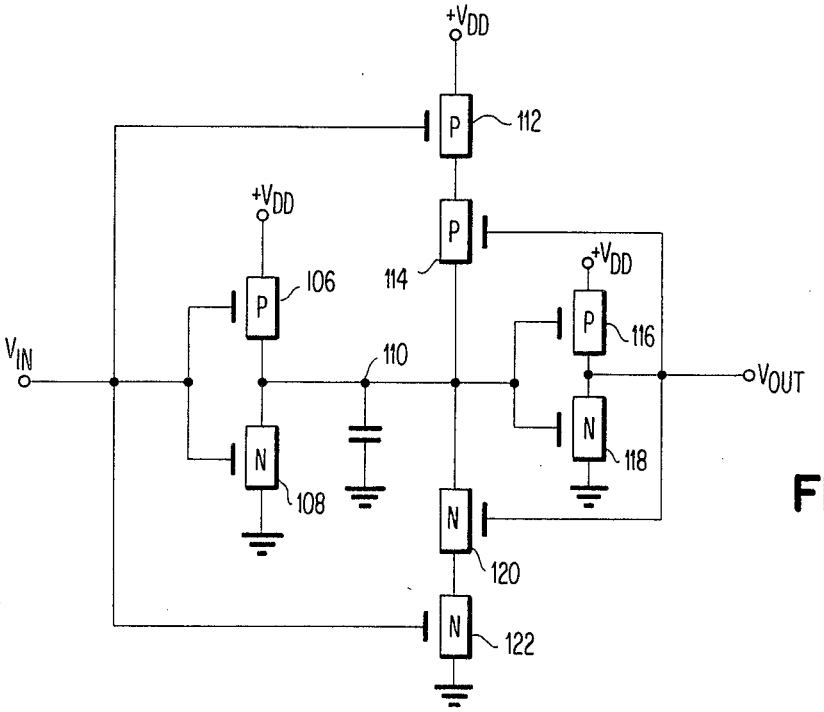

United States Defensive Publication [19] (H) [11] T955,006

Cavaliere et al. [43] Feb. 1, 1977

[54] DELAY CIRCUITS USING NEGATIVE RESISTANCE CMOS CIRCUITS

[75] Inventors: Joseph Richard Cavaliere, Hopewell Junction; David Barry Eardley, Stanfordville, both of N.Y.

[73] Assignee: International Business Machines Corporation, Armonk, N.Y.

[21] Appl. No.: 695,716

[22] Filed: June 14, 1976

Related U.S. Application Data

[63] Continuation of Ser. No. 536,080, Dec. 24, 1974, abandoned.

[51] Int. Cl.[2] ..... H03K 17/04; H03K 17/60; H03K 19/08; H03K 19/20

[52] U.S. Cl. ..... 307/251; 307/205

[57] ABSTRACT

A negative resistance circuit constructed of complementary field effect transistors has several applications. A voltage change at an input to the negative resistance circuit alters the current at the input node in a direction inverse to that normally caused by such a voltage change. The circuit can be used to speed up the charging or the discharging of a circuit node capacitance.

11 Claims, 3 Sheets Drawing,

19 Pages Specification

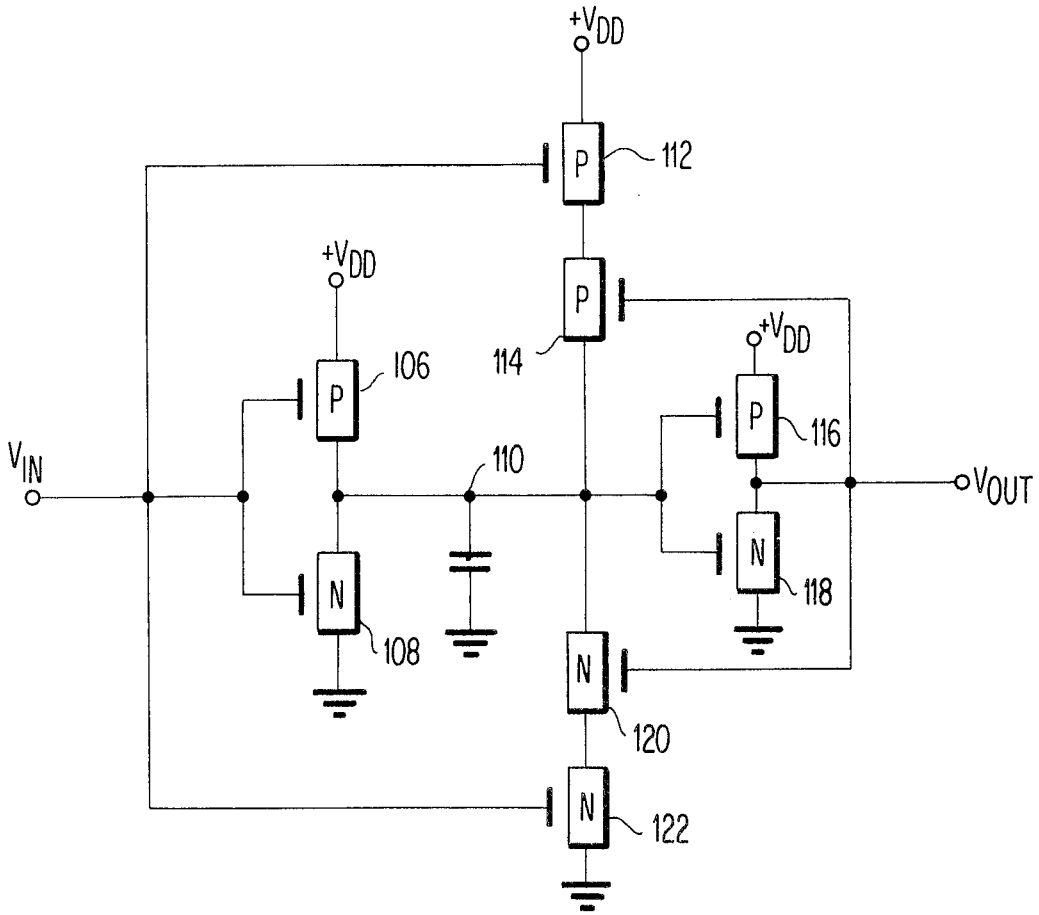

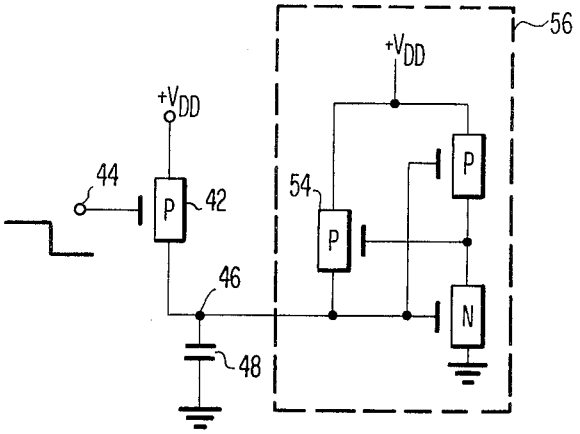
FIG. 7
FIG. 8
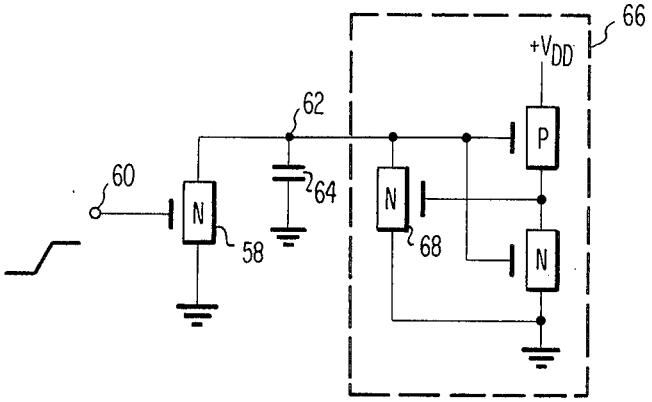
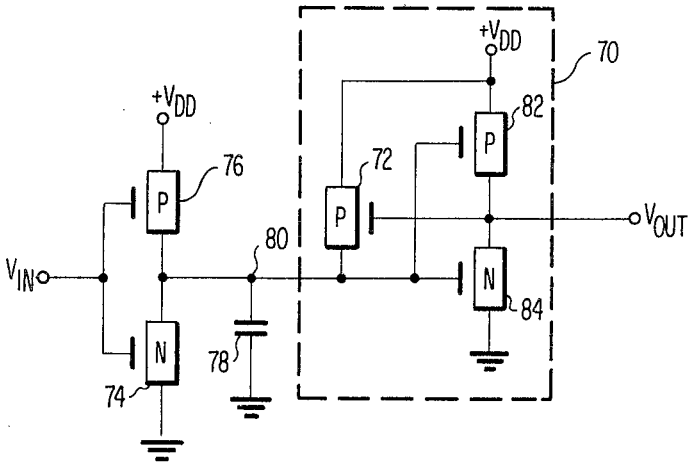
FIG. 9
FIG. 10
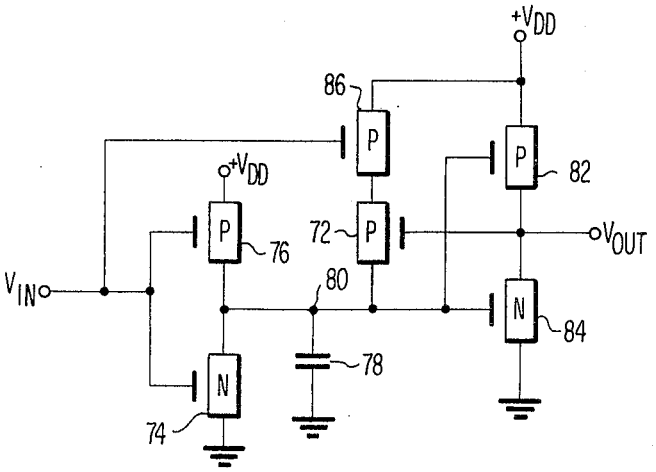

The file of this unexamined application may be inspected and copies thereof may be purchased (849 O.G. 1221, Apr. 9, 1968).